(12) United States Patent
DCamp et al.

(10) Patent No.: US 7,297,573 B2
(45) Date of Patent: Nov. 20, 2007

(54) METHODS AND APPARATUS FOR PARTICLE REDUCTION IN MEMS DEVICES

(75) Inventors: Jon B. DCamp, Savage, MN (US); Harlan L. Curtis, Champlin, MN (US); Lori A. Dunaway, New Hope, MN (US); Max C. Glenn, Chanhassen, MN (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 11/280,040

(22) Filed: Nov. 16, 2005

(65) Prior Publication Data

US 2006/0076633 A1  Apr. 13, 2006

Related U.S. Application Data

(62) Division of application No. 10/431,418, filed on May 7, 2003, now Pat. No. 6,987,304.

(51) Int. Cl.
*H01L 23/12* (2006.01)

(52) U.S. Cl. ............... 438/108; 438/108; 438/471; 438/25; 438/48; 438/58; 438/64

(58) Field of Classification Search ........... 438/108, 438/471, 25, 48, 58, 64
See application file for complete search history.

(56) References Cited

U.S. PATENT DOCUMENTS

| 6,140,144 | A  | 10/2000 | Najafi et al. |
| 6,225,692 | B1 | 5/2001  | Hinds |
| 6,335,224 | B1 | 1/2002  | Peterson et al. |
| 6,441,481 | B1 | 8/2002  | Karpman |
| 6,452,238 | B1 | 9/2002  | Orcutt et al. |
| 6,455,878 | B1 | 9/2002  | Bhat et al. |
| 6,472,739 | B1 | 10/2002 | Wood et al. |
| 6,479,320 | B1 | 11/2002 | Gooch |
| 6,555,417 | B2 | 4/2003  | Spooner et al. |
| 2002/0075551 | A1 | 6/2002 | Daneman et al. |
| 2002/0089044 | A1 | 7/2002 | Simmons et al. |
| 2002/0089835 | A1 | 7/2002 | Simmons |
| 2002/0090749 | A1 | 7/2002 | Simmons |
| 2002/0113296 | A1 | 8/2002 | Cho et al. |
| 2002/0132391 | A1 | 9/2002 | Saia et al. |
| 2002/0173080 | A1 | 11/2002 | Saia et al. |

(Continued)

FOREIGN PATENT DOCUMENTS

EP   0 720 260 A1   7/1996

OTHER PUBLICATIONS

Gilleo, Ken, "MEMS Packaging and Assembly Issues", SMTA International Proceedings of the Technical Program, Sep. 24, 2000, pp. 784-789, XP008020112.

*Primary Examiner*—Long Pham

(57) ABSTRACT

A method for assembling a micro-electromechanical system (MEMS) device that includes a micro-machine is described. The method comprises forming the micro-machine on a die, the die having a top surface and a bottom surface, providing a plurality of die bonding pedestals on a surface of a housing, and mounting at least one of the top surface of the die and components of the micro-machine to the die bonding pedestals such that a bottom surface of the die at least partially shields components of the micro-machine from loose gettering material.

9 Claims, 3 Drawing Sheets

U.S. PATENT DOCUMENTS

| | | |
|---|---|---|
| 2002/0179986 A1 | 12/2002 | Orcutt et al. |
| 2003/0002265 A1 | 1/2003 | Simmons |
| 2003/0006502 A1 | 1/2003 | Karpman |
| 2003/0020062 A1 | 1/2003 | Faris |
| 2003/0020094 A1* | 1/2003 | Shrauger .................... 257/200 |
| 2004/0189198 A1 | 9/2004 | Wang et al. |

* cited by examiner

US 7,297,573 B2

METHODS AND APPARATUS FOR PARTICLE REDUCTION IN MEMS DEVICES

CROSS REFERENCE TO RELATED APPLICATIONS

This application is a divisional application of U.S. patent application Ser. No. 10/431,418, filed May 7, 2003 now U.S. Pat. No. 6,987,304, which is hereby incorporated by reference in its entirety.

BACKGROUND OF THE INVENTION

This invention relates generally to manufacturing of Micro Electromechanical System (MEMS) devices, and more specifically to, getter devices and problems caused by gettering materials within MEMS devices.

Micro-electromechanical systems (MEMS) include electrical and mechanical components integrated on the same substrate, for example, a silicon substrate. Substrates for MEMS devices are sometimes referred to as dies. The electrical components are fabricated using integrated circuit processes, while the mechanical components are fabricated using micromachining processes that are compatible with the integrated circuit processes. This combination makes it possible to fabricate an entire system that fits within a chip carrier using standard manufacturing processes.

One common application of MEMS devices is utilization within inertial sensor. The mechanical portion of the MEMS device provides the sensing capability for the inertial sensor, while the electrical portion of the MEMS device processes the information received from the mechanical portion. One example of an inertial sensor that utilizes a MEMS device is a gyroscope.

The MEMS production process involves the placement of the operational portion of the MEMS device, sometimes referred to as a micro-machine, within a chip carrier or housing, which is then hermetically sealed. Getters are sometimes attached to the housing to facilitate removal of water vapor and hydrogen, for example.

Getters can however, release particles that can interfere with operation of the MEMs device. In one example, a MEMS gyroscope and other MEMS based inertial devices can be exposed to high-G forces that may cause an amount of particles to be released from the getter, and come into contact with moving components of the MEMS device.

BRIEF SUMMARY OF THE INVENTION

In one aspect, a method for assembling a micro-electromechanical system (MEMS) device that includes a micro-machine is provided. The method comprises forming the micro-machine on a die, the die having a top surface and a bottom surface, providing a plurality of die bonding pedestals on a surface of a housing, and mounting at least one of the top surface of the die and components of the micro-machine to the die bonding pedestals such that a bottom surface of the die at least partially shields components of the micro-machine from loose gettering material.

In another aspect, a micro-electromechanical system (MEMS) device is provided that comprises a micro-machine comprising a die and at least one each of a proof mass, a motor drive comb, a motor pick-off comb, and a sense plate. The MEMS device also comprises a housing configured to hold the micro-machine, a cover to be attached to the housing, to form a substantially sealed cavity, and a getter within the substantially sealed cavity. The micro machine is attached to the housing such that the die shields the proof mass, the motor drive comb, the motor pick-off comb, and the sense plate from particles that become dislodged from the getter.

In still another aspect, a micro-electromechanical system (MEMS) gyroscope is provided that comprises a housing and a micro-machine comprising a die, at least one sense plate, at least one proof mass suspended a distance from said at least one sense plate, at least one motor drive comb and at least one motor pick-off comb. The gyroscope also comprises a getter comprising gettering material and a cover attached to the housing forming a substantially sealed cavity for the micro-machine and getter. The die is mounted within the cavity such that any gettering material that becomes dislodged from the getter is at least partially prevented from contacting the sense plates, the proof masses, the motor drive combs, and the motor pick-off combs.

In yet another aspectt, a method for mounting a micro-machine portion of a micro-electromechanical system (MEMS) within a housing portion of the MEMS that also contains a getter is provided. The method comprises forming a micro-machine on a die and orienting the micro-machine within the housing such that the die is between the getter and components of the micro-machine.

In yet still another aspect, a micro-electromechanical system (MEMS) accelerometer is provided that comprises a housing, a micro-machine, a getter, and a cover attached to the housing. The micro-machine comprises a die, at least one sense plate, at least one proof mass suspended a distance from the at least one sense plate, at least one motor drive comb and at least one motor pick-off comb. The getter includes a gettering material, and the cover and housing are configured to form a substantially sealed cavity for the micro-machine and getter. The die is mounted within the cavity such that gettering material that becomes dislodged from the getter is substantially blocked from contacting the sense plates, proof masses, motor drive combs, and motor pick-off combs.

DETAILED DESCRIPTION OF THE INVENTION

Figure 1:
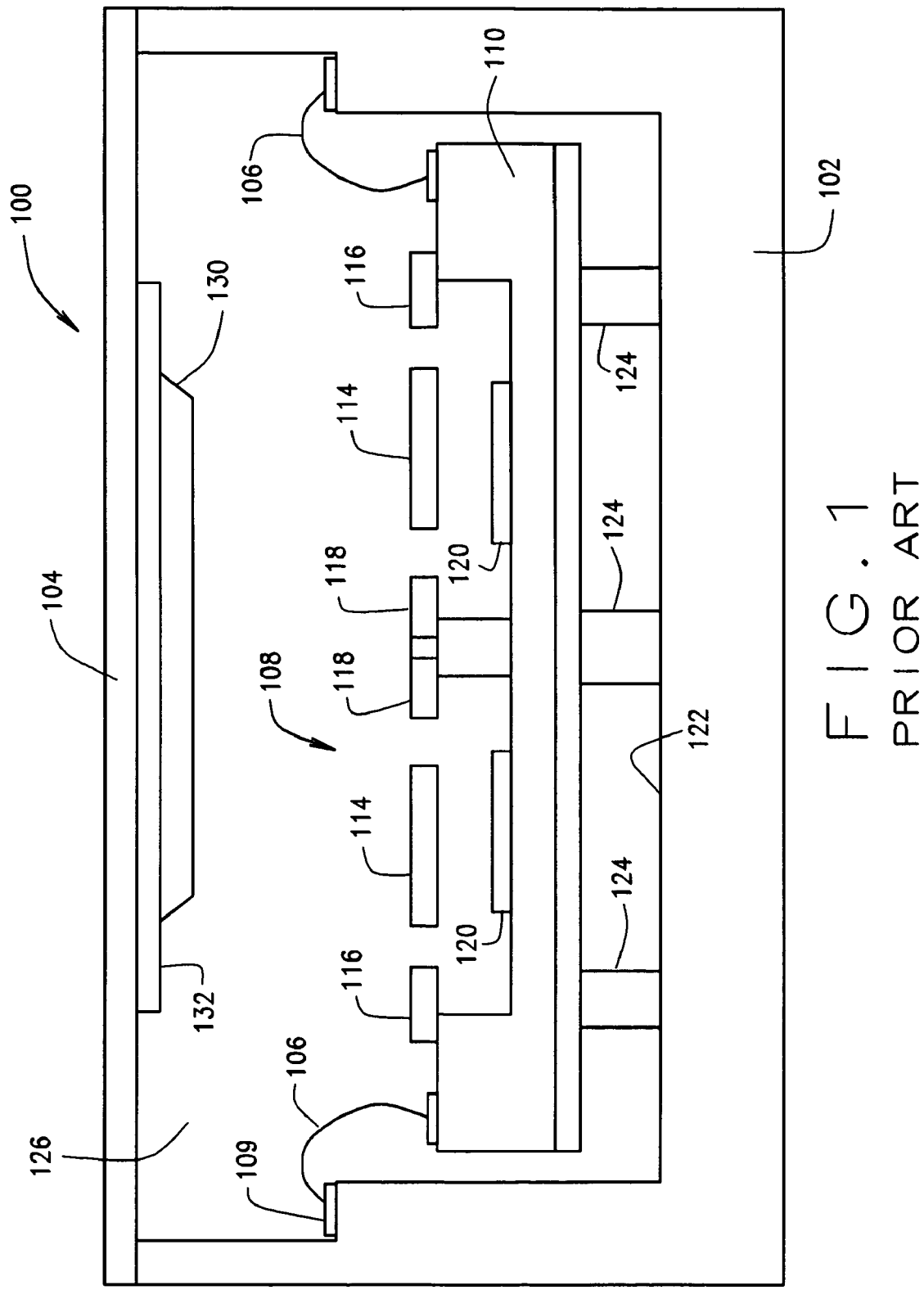
FIG. 1 is a side view of a known MEMS device utilizing a getter.

FIG. 1 is a diagram of one known embodiment of a Micro-Electromechanical System (MEMS) 100. MEMS 100 includes a housing 102 (sometimes referred to as a chip carrier) to which a cover 104 is eventually attached in order to form a sealed cavity. Electrical leads 106 provide electrical connections to a micro-machine 108 which includes a die 110 that is attached to housing 102. As shown in FIG. 1, electrical connections 109 are provided through housing 102 to external devices (not shown). For example, in the case of a MEMS tuning fork gyroscope, micro-machine 108 includes, proof masses 114, motor drive combs 116, and motor pick-off combs 118. Micro-machine 108 further includes sense plates 120 which form parallel plate capacitors with proof masses 114. In one embodiment, sense plates 120 are metal films that have been deposited and patterned onto die 110. Die 110 is attached to a bottom surface 122 of housing 102 utilizing contacts 124. Contacts 124 are sometimes referred to as die bonding pedestals. In one embodiment, the attachment of die 110, contacts 124, and housing 102 is accomplished utilizing a thermocompression bonding process or another known bonding process.

Upon attachment of micro-machine 108 to housing 102, cover 104 is attached to housing 102 to form a substantial hermetic seal. In one embodiment, a cavity 126 is formed when cover 104 is attached to housing 102. Cavity 126 is first evacuated to remove any gases (i.e. oxygen, hydrogen, water vapor) within cavity 126. Cavity is then backfilled with a dry gas to a controlled pressure. Typically the dry gas is an inert gas, for example, nitrogen or argon. In another embodiment, cover 104 is attached to housing 102 under vacuum conditions, and a vacuum is formed within cavity 126. Cavity 126 provides an environment that allows components of micro-machine 108 to move freely. For example, proof masses 114 may be movably coupled to die chip 110 and therefore may oscillate within the vacuum of cavity 126.

However, the seal between housing 102 and cover 104 is typically not absolute. In one embodiment, a getter 130 which includes a gettering material (not shown) is attached to a getter substrate 132. Getter substrate 132 is then attached to cover 104. Getter 130 removes water vapor or other gases (e.g. hydrogen) within cavity 126, as is known in the art. These gases are known to permeate the seal between housing 102 and cover 104 over time and are also known to be emitted over time (into cavity 126) by the materials which make up housing 102 and cover 104. Removal of the water vapor and gases facilitates maintaining the environment within cavity 126. The gettering material of getter 130 is typically particle based, and as described above, some gettering material may break free from getter 130.

Figure 2:
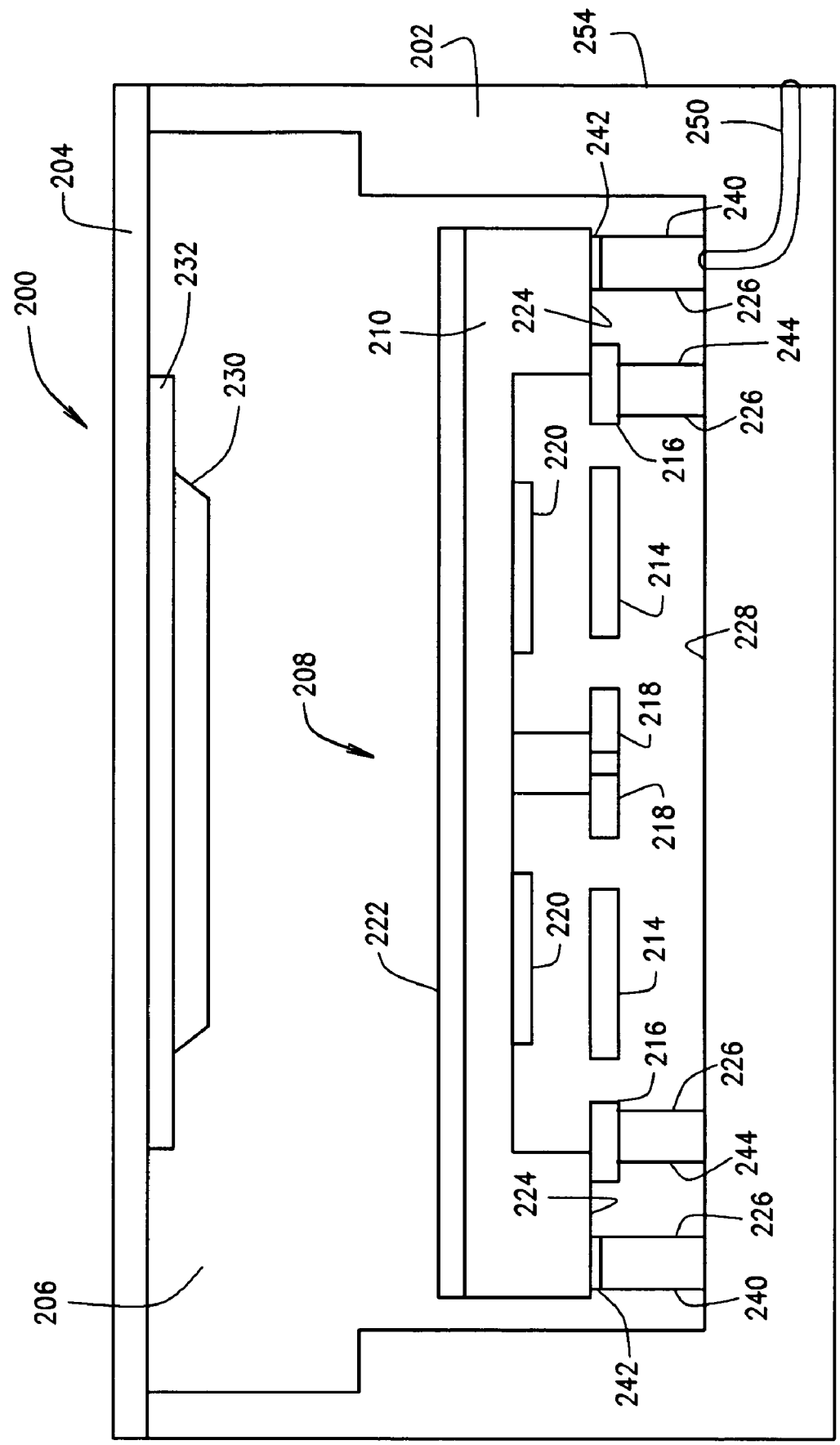
FIG. 2 is a side view of a MEMS device where the micro-machine is mounted in a flipped configuration.

FIG. 2 illustrates a side view of a MEMS device 200 that includes a housing 200 onto which a cover 204 is attached to provide a substantially sealed cavity 206. MEMS device 200 includes a micro-machine 208 that is attached to housing 202 in a flipped configuration. The term flipped, as used herein, refers to a mounting orientation of a micro-machine within a housing which is upside down as compared to known mounting orientations. Micro-machine 208 includes a die 210, proof masses 214, motor drive combs 216, and motor pick-off combs 218. Micro-machine 208 further includes sense plates 220 which form parallel plate capacitors with proof masses 214. In one embodiment, sense plates 220 are metal films that have been deposited and patterned onto die 210. Proof masses 214, motor drive combs 216, motor pick-off combs 218, and sense plates 220 are mounted onto die 210 utilizing known processes. However, rather than mounting a bottom surface 222 of die 210 directly to die bonding pedestals, as is done in known MEMS devices, micro-machine 208 is flipped over before being attached to the die bonding pedestals, and therefore other portions of micro-machine 208 are attached to the die bonding pedestals, as further described below.

As shown in FIG. 2, motor drive combs 216 and a top surface 224 of die 210 is attached to die bonding pedestals 226, which are located on a bottom surface 228 of housing 202, typically through a thermocompression bonding process. In one embodiment, die bonding pedestals 226 are gold contacts. By flipping micro-machine 208, die 210 is also flipped, and bottom surface 222 of die 210 provides protection for operational and moveable portions (e.g. proof masses 214 and sense plates 220, and portions of motor drive combs 216 and motor pick-off combs 218) of micro machine 208. Protection is provided such that particles of gettering material which become dislodged from getter 230, for example, due to vibration, are blocked from components of micro-machine 208, due to the orientation of micro-machine 208 with respect to getter 230.

Orientation of die 210 and arrangement of die bonding pedestals 226 also allows such pedestals to be utilized as electrical contacts for components of micro-machine 208. Referring again to FIG. 2, pedestals 240 are in contact with electrical nodes 242 on die 210, and pedestals 244 are in electrical contact with motor drive combs 216. Pedestals 240 and 244 also provide electrical contact with circuits outside of housing 202, for example, through one of a plurality of electrical conductors 250. One electrical conductor 250, is illustrated as providing an electrical path from bottom surface 228 of housing 202 to an exterior surface 254 of housing 202. A number of such electrical connections utilizing electrical conductors similar to conductor 250 are further described with respect to FIG. 3 below. Additional connections to such conductors can be made to components of micro-machine 208 with additional pedestals 226.

MEMS device 200 may comprise more or fewer components than described. For instance, while four electrical connections are illustrated (e.g. four pedestals 226), those skilled in the art will recognize that a MEMS device may comprise more than two contacts and/or extruding pins as well. Additionally, more or fewer members (proof masses, drive combs, pick-off combs, etc.) may be present in MEMS device 200 other than those components above described. Further, components of MEMS device 200 may comprise multiple functions. Micro-machine 208 may be any such electromechanical machine used in accordance with MEMS and MEMS based devices. In addition, alternate packages may be used as well to provide a housing for MEMS device 200. The illustrations in the Figures are intended to show embodiments for mounting a micro-machine that provides protection from dislodged gettering material rather than provide a description of a specific MEMS device.

Figure 3:
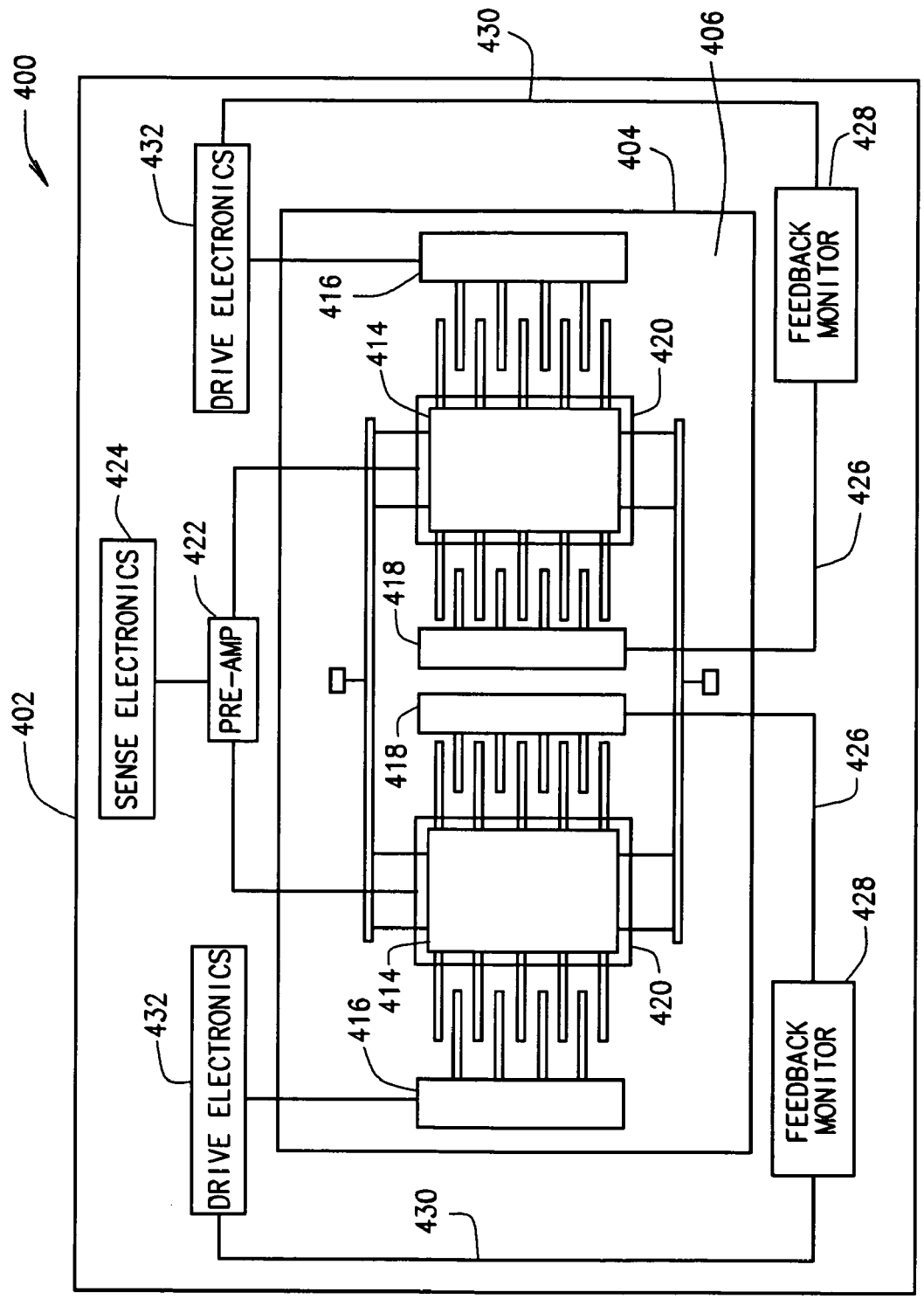
FIG. 3 is a schematic view of a MEMS gyroscope which can be produced utilizing the micro-machine described with respect to FIG. 2.

FIG. 3 is a schematic illustration of a MEMS gyroscope 400 which incorporates a micro-machine oriented similarly to micro-machine 208, described with respect to FIG. 2. Such an orientation has been referred to herein as a flipped or upside down orientation. MEMS gyroscope 400 includes a housing 402 (similar to housing 202 (shown in FIG. 2)) that includes therein a micro-machine which is a tuning fork gyroscope (TFG) 404. Housing 402 is sealed with a cover (not shown). Housing 402 may be a plastic package, a small outline integrated circuit (SOIC) package, a ceramic leadless chip carrier, a plastic leaded chip carrier (PLCC) package, a quad flat package (QFP), or other housings as known in the art. Housing 402 may provide a structure to co-locate elements of TFG 404 and/or locate other elements within a close proximity of one another within the housing 402. TFG 404, in one embodiment, is located within a substantially sealed cavity 406 which is formed by bonding the cover to housing 402.

In one embodiment, TFG 404 includes proof masses 414, motor drive combs 416, motor pick-off combs 418, and sense plates 420 constructed on a wafer. A pre-amplifier 422 may be included within housing 402 and is electrically connected or coupled to each proof mass 414 and sense plate 420 combination, for example, through die bonding pedestals 226 (shown in FIG. 2). Pre-amplifier 422 and TFG 404 may both be formed on a common substrate and, in one embodiment, are electrically connected. In other embodiments, pre-amplifier 422 is electrically connected to proof masses 414. An output of pre-amplifier 422 is sent to sense electronics 424, or alternatively, pre-amplifier 422 may be incorporated within sense electronics 424.

In addition, an output 426 of motor pick-off combs 418 is transferred to feedback monitors 428. Feedback monitors 428 provide output signals 430 to drive electronics 432, which power motor drive combs 416. Alternatively, feedback monitors 428 may be incorporated within drive electronics 432. MEMS gyroscope 400 may also include a system power source and other operational electronics, which are not shown in FIG. 3 for ease of illustration.

In other embodiments (not shown) one or more of pre-amplifier 422, sense electronics 424, feedback monitors 428, and drive electronics 432 may be mounted on bottom surface 222 (shown in FIG. 2) of die 210 (shown in FIG. 2). To make electrical connections between these components and components external to housing 202 (shown in FIG. 2), housing 202 can be configured with electrical leads 106 and electrical connections 109, similar to those shown in FIG. 1.

Motor drive combs 416 excite the proof masses 414 using electrostatic forces by applying a voltage to electrodes of proof masses 414. Motor pick-off combs 418 monitor the excitation or oscillation of proof masses 414 by monitoring voltage signals on electrodes on proof masses 414. Motor pick-off combs 418 output a feedback signal to feedback monitors 428. Feedback monitor 428 provides an output 430 which is input to drive electronics 432. If proof masses 414 begin to oscillate too fast or too slow, drive electronics 432 may adjust an oscillation frequency such that proof masses 414 vibrate at a resonant frequency. Excitation at such a frequency may enable a higher amplitude output signal to be generated. Many or all of the above described electrical interconnections may be accomplished utilizing die bonding pedestals when the micro-machine is in a flipped configuration.

While operation of gyroscope 400 is described, such operation is not likely if particles of gettering materials, for example, as described above, are released within cavity 406. By orienting the micro-machine in an upside down or flipped configuration, a secondary cavity is essentially obtained which substantially reduces probabilities of gettering particles coming into contact with components, of the micro-machine, including those components which need to be able to move freely for proper operation.

Such a flipped micro-machine configuration is further usable in other sensor based-devices. It is contemplated to utilize the flipped micro-machine orientation and method described herein in a variety of MEMS devices, including, but not limited to, MEMS inertial measurement units, gyroscopes, pressure sensors, temperature sensors, resonators, air flow sensors, and accelerometers.

While the invention has been described in terms of various specific embodiments, those skilled in the art will recognize that the invention can be practiced with modification within the spirit and scope of the claims.

What is claimed is:

1. A method for assembling a micro-electromechanical system (MEMS) device, the device including a micro-machine, said method comprising:

forming the micro-machine on a die, the die having a top surface and a bottom surface;

providing a plurality of die bonding pedestals on a surface of a housing; and mounting at least one of the top surface of the die and components of the micro-machine to the die bonding pedestals such that a bottom surface of the die is between moving components of the micro-machine and a gettering device, and at least partially shields the moving components of the micro-machine from loose gettering material.

2. A method according to claim 1 wherein said mounting comprises mounting the die such that the bottom surface of the die is between the getter and a proof mass, a motor drive comb, a motor pick-off comb, and a sense plate.

3. A method according to claim 1 further comprising providing electrical connections to the components of the micro-machine through the die bonding pedestals.

4. A method according to claim 3 further comprising providing electrical conductors from the die bonding pedestals to an exterior of the housing.

5. A method according to claim 1 wherein said mounting comprises attaching the micro-machine to the die bonding pedestals using a thermocompression bonding process.

6. A method for protecting components of a micro-machine within a housing from loose gettering material within the housing, the micro-machine formed on a die, said method comprising:

mounting a gettering device containing gettering material on the housing potion;

positioning a bottom surface of the die to at least partially shield the micro-machine components from the gettering material escaping from the gettering device; and attaching at least one of a top surface of the die and components of the micro-machine to die bonding pedestals on a surface of the housing.

7. A method according to claim 6 further comprising providing electrical connections to the components of the micro-machine through the die bonding pedestals.

8. A method according to claim 7 further comprising providing electrical conductors from the die bonding pedestals to an exterior of the housing.

9. A method according to claim 6 wherein said mounting comprises attaching the micro-machine to the die bonding pedestals using a thermocompression bonding process.

* * * * *